United States Patent [19]
Oda et al.

[11] Patent Number: 5,645,927
[45] Date of Patent: Jul. 8, 1997

[54] HEAT-RESISTING CUSHION MATERIAL AND METHOD FOR PRODUCING THE SAME

[75] Inventors: Hiroyuki Oda, Kashiwa; Tetsuo Takeuchi, Ichikawa; Kazuyuki Shimizu, Matsudo, all of Japan

[73] Assignee: Ikchikawa Co., Ltd., Tokyo, Japan

[21] Appl. No.: 574,601

[22] Filed: Dec. 18, 1995

[30] Foreign Application Priority Data

Dec. 16, 1994 [JP] Japan ................................. 6-333979

[51] Int. Cl.⁶ ................................................ B32B 27/34
[52] U.S. Cl. ............................................. 442/388; 442/392
[58] Field of Search .................................. 428/246, 286, 428/287

[56] References Cited

U.S. PATENT DOCUMENTS

| 4,463,465 | 8/1984 | Parker et al. | 5/459 |
| 4,750,443 | 6/1988 | Blaustein et al. | 112/420 |

*Primary Examiner*—Christopher Raimund
*Attorney, Agent, or Firm*—Howson and Howson

[57] ABSTRACT

The base layer of the cushion material is comprised of a ground body of meta-aromatic polyamide fibers and a bonding layer of substantially non-drawn meta-aromatic polyamide fibers integrated by needling. The airtight layer over the base layer comprises a non-woven fabric sheet of meta-aromatic polyamide fibers. The non-woven fabric sheet is integrated to the base layer under pressure by applying temperatures at or above the glass transition temperatures but at or below the decomposition temperatures of the constitutent fibers of the bonding layer.

3 Claims, 1 Drawing Sheet

HEAT-RESISTING CUSHION MATERIAL AND METHOD FOR PRODUCING THE SAME

FIELD OF INVENTION

The present invention relates generally to a heat-resisting cushion material; and more particularly to a heat-resisting cushion material and its producing method having an airtight layer suitable for a hot press machine used in manufacturing laminated sheets for printed circuits boards, decorative plywood for architecture, and like items.

BACKGROUND OF INVENTION

Laminated boards for printed circuits are generally manufactured by layering a copper foil on resin-impregnated fabric or so-called prepreg, and then pressing them between hot plates. The resin initially reduces in viscosity to a liquid state, and then gradually hardens. For uniform temprature and pressure distribution, cushion materials capable of enduring repeated use under high temperatures and high pressures are installed on the platens. On the surface of said heat-resisting cushion material, airtightening processing is usually performed for the purpose of preventing the fibrous materials forming the cushion material from falling therefrom or for improving the applicability of sucking force of a vacuum conveying machine.

In order to form the airtight layer on the surface as mentioned above, it is known in Patent Laid-open Gazette No. 128544/1982 to laminate thermoplastic fibers on the surface of the cushion material and to cause the thermoplastic layer to melt and form a film by means of hot rolls and to coat a resin thereon having a good releasing property. Alternatively, it is also known to bond a metallic plate, such as, a copper foil, to the surface of the cushion material by means of a thermosetting resin adhesive (epoxy reisn, etc.).

However, in the first ease, thermoplastic fibers are melted to form a sheet, so that it lacks flexibility, prone to cracks under a bending stress, and functions inadequately as a surface layer. Also, it takes a long time to form an airtight layer and it is problematic in productivity.

On the other hand, in the second case, although it is free from the defects as mentioned before, when the bonding takes place, a hardening-contraction takes place which is peculiar to thermosetting resins, which may remain as a residual stress. Therefore, during use, the contraction of the cushion material as a whole progresses by small degress as the heating, pressing, cooling, releasing steps are repeated, which may cause the resultant products to become defective. Furthermore, thermosetting resins are liable to deteriorate easily; the metallic foils may easily fall off due to the difference in coefficients of heat elongation. In addition, since metallic plates may not be incinerated, incineration processing may not be employed so as to dispose the used cushion materials economically.

SUMMARY OF INVENTION

The object of the present invention is to provide a cushion material having an airtight layer which is free from cracks even if a bending stress is applied and is capable of being disposed by incineration unlike the case of metallic plates of copper foils as above-mentioned.

Another object of the present invention is to provide a method for securing an airtight layer to a base layer by not using adhesive means, such as, a thermosetting resin, which is likely to deteriorate easily.

In order to achieve the afore-mentioned objects, the present invention provides a cushion material comprising a base layer of heat-resisting fibers and an airtight layer of heat-resisting fibers formed on said base layer.

Further, the present invention provides a method for producing a heat-resisting cushion material comprising the steps of:

forming a base layer by integrating by needling a bonding layer comprising a fabric web having non-drawn meta-aromatic polyamide fibers as the main constituents on at least one surface of a ground body comprising substantially all meta-aromatic polyamide fibers, overlapping a non-woven fabric sheet of meta-aromatic polyamide fibers on the surface of said bonding layer, and pressing said layers at or above the glass transition temperatures but at or below the decomposition temperatures of the fibers forming said bonding layer.

The ground body may be selected from either a woven fabric or a fabric web of substantially all meta-aromatic polyamide fibers individually needled, or a woven fabric and a web integrated by needling. Furthermore, the bonding layer over said ground body may comprise a fabric web having non-drawn meta-aromatic polyamide fibers as the main constituents. Moreover, in order to provide an airtight surface layer on the ground body with said bonding layer therebetween, a non-woven fabric sheet of meta-aromatic polyamide fibers is utilized. Said non-woven fabric sheet may preferably have an uneven or irregular surface, or have a multitude of pores on the side opposing said bonding layer. An example of such a material is a sheet of paper made by a paper making machine from a water suspension of aramide synthetic pulps and short fibers.

The cushion material according to the present invention comprises a base layer and an airtight layer both of fibrous materials, so that there should be no cracks formed under a bending stress. Also, since only organic fibers are involved, the product may be disposed by incineration when disposal becomes necessary.

The bonding layer of the present invention needled to the gound body comprises non-drawn meta-aromatic polyamide fibers. Said fibers soften at or above the glass transition temperatures but at or below the decomposition temperatures and exhibit the so-called "autoadhesion" property. Such a property is specific to the non-drawn fibers and is not observed with respect to the drawn fibers.

Thus, if hot pressing is conducted on said bonding layer with a non-woven fabric sheet having an uneven surface or a multitude of small pores overlapping said bonding layer, the constituent fibers of said bonding layer cooperate with the uneven surface or small pores thereof and as a result of the autoadhesion property of the bonding layer as well as the physical bonding between the uneven surface or pores and the non-drawn fibers, the two members may firmly be integrated together. The bonding thus achieved is different from the integration as result of hardening of, such as, a thermosetting resin.

As mentioned above, the bonding layer and the airtight layer are comprised of similar fibrous materials, and the cushion material has been heat treated at or above the glass transition temperatures, namely, at or above the temperatures at which the cushion material is utilized, the change in dimension during use is relatively small and the state of integration of the two layers being stable. Therefore, wrinkles will not be formed even if the cushion material is subjected to bending during use. Further, the airtight layer will not easily come off the bonding layer assuring a stable use for a long period of time.

The non-woven fabric sheet which is air permeable before the hot press operation becomes airtight as the uneven surface or pores become filled by the non-drawn fibers. The thus formed airtight layer is non air-permeable and dense. Consequently, the product is capable of being conveyed by means of an automatic loading system utilizing suction disks and anti-wear property of the surface may be improved. Also, occurrence of fibrous waste maybe prevented. Since both the airtight layer and the base layer are comprised of organic fibers, disposal by incineration is advantageously available.

DETAILED DESCRIPTION

Embodiments of the present invention will now be explained with reference to the accompanying drawings.

Figure 1:
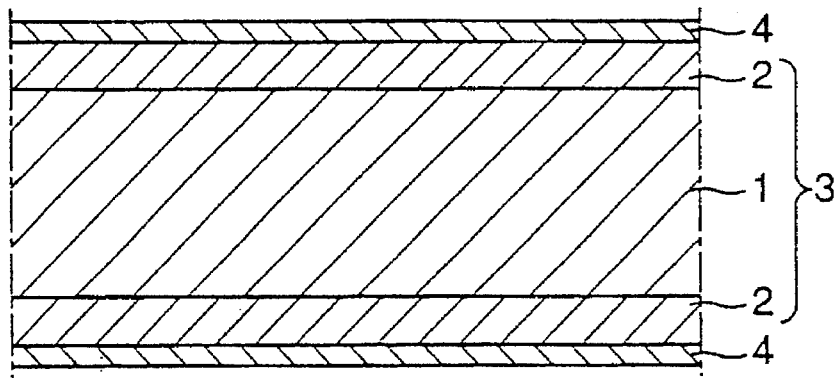
FIG. 1 is a partial sectional view of an embodiment of the present invention.
Figure 2:
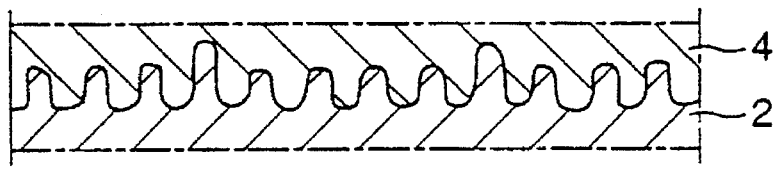
FIG. 2 is an enlarged shematic sectional view illustrating entanglement of the bonding layer and the airtight layer.

Referring to FIG. 1, a heat-resisting cushion material comprises a ground body 1 in which the constituents are meta-aromatic polyamide fibers of basis weight of 1000 g/m$^2$ Metsuke such as Conex sold by Teijin Ltd. and two bonding layers 2, 2 which consist of basis weight of 150 g/m$^2$ Metsuke webs of 100% non-drawn meta-aromatic polyamide fibers 3-denier×38 mm in size such as Conex WUD cotton sold by Teijin Ltd. The two bonding layers 2, 2 are respectively overlapped on both surfaces of the ground body 1 and are integrated by needle punching so that they form a base layer 3 of basis weight 1300 g/m$^2$ Metsake.

In the next place, two non-woven fabric sheets 4, 4 of meta-aromatic polyamide fibers such as Nomex Paper sold by du Pont Company are respectively overlapped on both surfaces of the bonding layers 2, 2 and then are hot pressed by hot platens (not shown). The operation was at 300° C. temperature and 10 kg/cm$^2$ pressure for 15 minutes. The resulting inventive heat-resisting cushion material has a density of 0.7 g/cm$^3$.

In the above-mentioned inventive cushion material, the bonding layers 2, 2 placed over the base layer 3 soften and become autoadhesive at or above the glass transition temperatures but at or below the decomposition temperatures of the constituent fibers (at 300° C. in the illustrated example) and the component fibers fill the uneven surface or pores of the airtight layer 4. Thus, the two layers may be firmly integrated together in a manner different from the integration by means of thermosetting resins.

Figure 3:
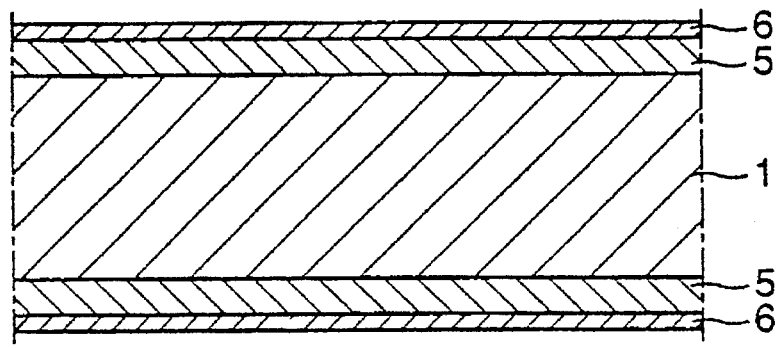
FIG. 3 is a partial sectional view showing a conventional cushion material A.
Figure 4:
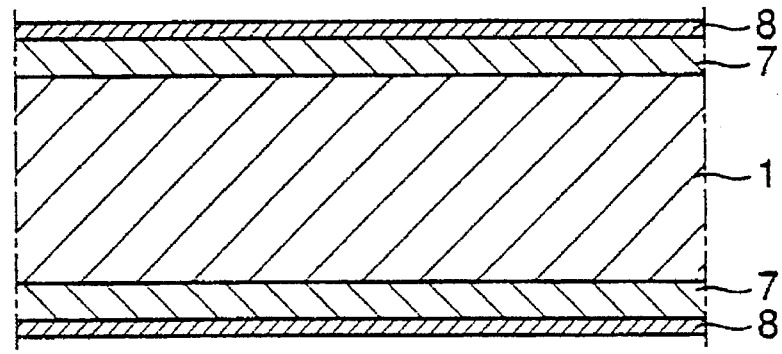
FIG. 4 is a partial sectional view showing another conventional cushion material B.

In the next place, by way of comparison, a conventional product A has been obtained as shown in FIG. 3 by placing bonding layers 5, 5 and release layers 6, 6 on both sides of a ground body 1 which is the same as that of the inventive product. The bonding layers 5, 5 comprise melted thermoplastic fibers. Also, a conventional product B has been obtained by bonding copper foils 8, 8 of 35 μm thickness by means of thermosetting resin adhesive (epoxy resin) to the surfaces of a ground body 1 which is the same as that of the inventive product with a hot press operation under the condition of 180° C. temperature and 50 kg/cm$^2$ pressure for 15 minutes. Metallic plates other than copper foils may also be employed.

In the next place, experiments were conducted to determine the durability (behavior under flexing, falling out of fibers and separability of the airtight layer) of the inventive product, the conventional product A and another conventional product B by repeating heating and cooling cycles with a unit cycle of 2 hours at 180° C. temperature and 50 kg/cm$^2$ pressure. The results have shown that the inventive product was stably usable even after 300 times pressing operation with little areal contraction.

By way of contrast, in case of the conventional product B, contraction gradually progressed and when the pressing operation has reached 150 times, the copper foils 8, 8 have exfoliated from the ground body 1 and the product has become no longer utilizable. Also, in case of the conventional product A, the bonding layers 5, 5 have exhibited heat deterioration and when the pressing operation has reached 100 time, cracks have been generated and the product was no longer utilizable.

In the above-mentioned example, the bonding layers 2, 2 are arranged on both sides of the ground body 1; but the bonding layer 2 may be provided on one surface only of the ground body 1. Also, although the ground body 1 comprises a fabric in the illustrated example, needless to say, it may comprise needled webs alone or webs and woven fabrics integrated by needling.

Furthermore, the sizes or basis weight Metsuke, etc. are not limited to those illustrated above and may be determined as desired. In addition, in the bonding layers 2, 2 in the above example, 100% non-drawn fibers (meta-aromatic polyamide fibers) are employed; but, so long as said fibers are mainly utilized, drawn fibers (meta-aromatic polyamide fibers) may also be mixedly used.

ADVANTAGES OF INVENTION

Since an airtight layer made of flexible, heat resistant fibers is formed on the surface of the ground body, the cushion material according to the present invention may be free from cracks or wrinkling even under a bending stress. Also, the cushion material may be disposed by incineration, as the material is constituted of fibrous materials as a whole.

Furthermore, the bonding layers according to the present invention comprises a fibrous web of all or substantially all non-drawn meta-aromatic polyamide fibers, and a non-woven fabric sheet having an uneven surface is overlapped thereon with an application of temperatures under pressure at or above the glass transition temperatures but at or below the decomposition temperatures of the bonding layer fibrous materials so that a firm integration takes place in a manner where the constituent fibers of the bonding layers fill the uneven surface of the non-woven fabric sheet.

In said bonding method, integration is not achieved as result of the melting of the component fibers, but a physical integration is effected as result of softening and pressure applied so that wrinkling is hard to arise in the airtight layer even under a bending stress, and also, separation of the airtight layer from the base layer is hard to take place even after a long use.

Finally, the surface of the airtight layer may be smooth and dense due to the heat and pressure applied during the hot press operation so that the permeability thereof substantially decreases. Thus, conveyance by an automatic loading system utilizing suction disks is possible with an improved anti-wear property with generation of fibrous wastes substantially prevented.

What is claimed is:

1. A cushion material comprising:

a base layer of heat-resisting fibers, the base layer comprising a ground body of substantially all meta-aromatic polyamide fibers and a bonding layer of a fabric web having non-drawn meta-aromatic polyamide fibers as its main constituent; and an airtight layer comprising a non-woven sheet of meta-aromatic polyamide fibers formed on said bonding layer.

2. A cushion material according to claim 1 wherein said ground body and bonding layer are integrated by needling.

3. A method for producing a heat-resisting cushion material comprising the steps of:

forming a base layer by integrating by needling a bonding layer comprising a fabric web having non-drawn meta-aromatic polyamide fibers as the main constituents on at least one surface of a ground body comprising substantially all meta-aromatic polyamide fibers, overlapping a non-woven fabric sheet of meta-aromatic polyamide fibers on the surface of said bonding layer, and pressing said layers at or above the glass transition temperatures but at or below the decomposition temperatures of the fibers forming said bonding layer.

* * * * *

UNITED STATES PATENT AND TRADEMARK OFFICE
CERTIFICATE OF CORRECTION

PATENT NO. : 5,645,927
DATED : July 8, 1997
INVENTOR(S) : Oda et al.

It is certified that error appears in the above-indentified patent and that said Letters Patent is hereby corrected as shown below:

Item [73]
On the cover page, after "Assignee", change "Ikchikawa" to --Ichikawa--.

At column 1, line 36, change "reisn" to --resin--
At column 1, line 37, change "ease" to --case--;
At column 2, line 40, change "gound" to --ground--;
At column 3, line 8, change "maybe" to --may be--;
At column 3, line 16, change "shematic" to --schematic--.

Signed and Sealed this

Fourth Day of November, 1997

Attest:

BRUCE LEHMAN

Attesting Officer

Commissioner of Patents and Trademarks